United States Patent
Miki

(10) Patent No.: US 9,720,531 B2
(45) Date of Patent: Aug. 1, 2017

(54) ELECTRONIC DEVICE

(75) Inventor: Tomohiro Miki, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/119,671

(22) PCT Filed: May 24, 2012

(86) PCT No.: PCT/JP2012/003400
§ 371 (c)(1),
(2), (4) Date: Nov. 22, 2013

(87) PCT Pub. No.: WO2012/160827
PCT Pub. Date: Nov. 29, 2012

(65) Prior Publication Data
US 2014/0085243 A1    Mar. 27, 2014

(30) Foreign Application Priority Data

May 24, 2011    (JP) ................................. 2011-116294

(51) Int. Cl.
*G06F 3/041* (2006.01)
*H01L 41/04* (2006.01)

(52) U.S. Cl.
CPC ............ *G06F 3/041* (2013.01); *G06F 3/0414* (2013.01); *G06F 3/0416* (2013.01); *H01L 41/042* (2013.01)

(58) Field of Classification Search
CPC ...... G06F 3/041; G06F 3/0416; G06F 3/0412; G06F 3/04883; G06F 3/0488; G06F 3/03545; G06F 3/044

USPC ........ 345/173–178; 178/18.01–18.09, 18.11; 340/4.12, 407.1; 463/30
See application file for complete search history.

(56) References Cited

U.S. PATENT DOCUMENTS

| | | | | |
|---|---|---|---|---|
| 4,714,935 A | * | 12/1987 | Yamamoto ............. | B41J 2/2128 310/317 |
| 6,703,762 B1 | * | 3/2004 | Okada .................. | H02N 2/0025 310/317 |
| 2002/0033644 A1 | * | 3/2002 | Takamura et al. ............ | 307/109 |

(Continued)

FOREIGN PATENT DOCUMENTS

| | | |
|---|---|---|
| JP | 2005-532778 A | 10/2005 |
| JP | 2009-169612 A | 7/2009 |

(Continued)

OTHER PUBLICATIONS

An Office Action; "Notice of Reasons for Rejection," issued by the Japanese Patent Office on Jun. 3, 2014, which corresponds to Japanese Patent Application No. 2013-516220 and is related to U.S. Appl. No. 14/119,671; with English language concise explanation.

(Continued)

*Primary Examiner* — Olga Merkoulova
(74) *Attorney, Agent, or Firm* — Studebaker & Brackett PC

(57) ABSTRACT

An electronic device capable of applying an appropriate driving signal to a piezoelectric element is provided. The electronic device 1 includes a piezoelectric element 31 and a control unit 40 configured to apply a driving signal to the piezoelectric element 31, and the control unit 40 applies a driving signal so that a voltage of a positive electrode of the piezoelectric element 31 is equal to or greater than a voltage of a negative electrode thereof.

5 Claims, 9 Drawing Sheets

(56) References Cited

U.S. PATENT DOCUMENTS

| | | | | |
|---|---|---|---|---|
| 2004/0007944 A1* | 1/2004 | Johansson | ............ | H02N 2/06 310/317 |
| 2009/0153966 A1* | 6/2009 | Matsumoto | ............ | G03B 17/00 359/508 |
| 2011/0163984 A1* | 7/2011 | Aono | ............ | G06F 3/016 345/173 |
| 2011/0260991 A1* | 10/2011 | Aono | ............ | 345/173 |

FOREIGN PATENT DOCUMENTS

| JP | 2010-044497 A | 2/2010 |
|---|---|---|
| WO | 2004/008621 A1 | 1/2004 |
| WO | 2011/013367 A1 | 2/2011 |

OTHER PUBLICATIONS

International Search Report; PCT/JP2012/003400; Jun. 26, 2012.

* cited by examiner

ELECTRONIC DEVICE

CROSS REFERENCE TO RELATED APPLICATION

This application claims priority to and the benefit of Japanese Patent Application No. 2011-116294 filed on May 24, 2011, the entire contents of which are incorporated herein by reference.

FIELD

The present invention relates to an electronic device that employs a piezoelectric element.

BACKGROUND

In recent years, in mobile terminals such as mobile phones, as a member that detects operation by the operator, an electronic device with a touch panel such as a touch sensor, a touch switch, and the like is increasing. Further, besides mobile terminals, electronic devices having a touch panel such as devices such as calculators, ticket vending machines and the like, home appliances such as microwaves, TV sets, lighting equipment and the like, and industrial equipment (FA equipment) and the like are widely used.

In such an electronic device having a touch panel, there is known an electronic device in which slippage of a touch panel from a fixing frame thereof is prevented, and in which a satisfactory feel of operation can be provided as well by attaching piezoelectric elements at the ends of the touch panel and by, when an input operation is executed by pressing the touch panel, operating the piezoelectric elements to vibrate the touch panel (see, for example, Patent Document 1).

CITATION LIST

Patent Document 1: JP2010044497A

SUMMARY

However, a piezoelectric element does not operate normally unless an applied voltage is appropriately controlled. When a piezoelectric element does not operate normally, for example, even if a voltage is applied to the piezoelectric element, a vibration amplitude may become smaller in comparison to the case of normal operation of the piezoelectric element.

The present invention provides an electronic device capable of applying an appropriate driving signal to a piezoelectric element.

An electronic device according to the present invention includes a piezoelectric element and a control unit configured to apply a driving signal to the piezoelectric element, and the control unit applies a driving signal so that a voltage of a positive electrode of the piezoelectric element is equal to or greater than a voltage of a negative electrode thereof.

Further, in the electronic device according to the present invention, the control unit applies, as the driving signal, a driving signal for positive electrode to the positive electrode of the piezoelectric element and a driving signal for negative electrode to the negative electrode of the piezoelectric element, and a minimum voltage of the driving signal for positive electrode is equal to or greater than a maximum voltage of the driving signal for negative electrode.

Furthermore, in the electronic device according to the present invention, a touch panel is further included, and the piezoelectric element, when being applied with the driving signal, displaces the touch panel to the operation face side of the touch panel.

Moreover, in the electronic device according to the present invention, the control unit controls a cycle of the driving signal applied to the piezoelectric element to be any cycle from a quarter cycle to a half cycle of a periodic wave.

Further, in the electronic device according to the present invention, a press detection unit configured to detect a press applied on an operation face of the touch panel is further included, and the control unit applies, when the data based on press detected by the press detection unit satisfies a predetermined criterion, the driving signal to the piezoelectric element.

According to the present invention, an appropriate driving signal may be applied to the piezoelectric element.

DESCRIPTION OF EMBODIMENTS

First, before describing an embodiment of the present invention, a method of applying a driving signal by the electronic device according to the present invention is described.

A piezoelectric element does not operate normally unless an applied voltage is appropriately controlled. In order to solve such the problem, the inventor focused attention on the physical property of the piezoelectric element and found that an abnormal operation of the piezoelectric element is caused by the depolarized state of the piezoelectric element when a voltage exceeding a predetermined range is applied to the piezoelectric element. The inventor found that, assuming that the voltage on one electrode A of the piezoelectric element is Va and that on the other electrode B thereof is Vb, the piezoelectric element is depolarized and vibrates no more, or even if it vibrates, the vibration amplitude may become smaller in comparison to the case of normal operation, unless the conditions 1 or 2 described below is satisfied.

$Va > Vb$              Condition 1

$|Va - Vb| \leq Vc$              Condition 2

Although Vc varies depending on the specification of the piezoelectric element, it was found out that Vc can be 12V, for example.

Figure 10A:
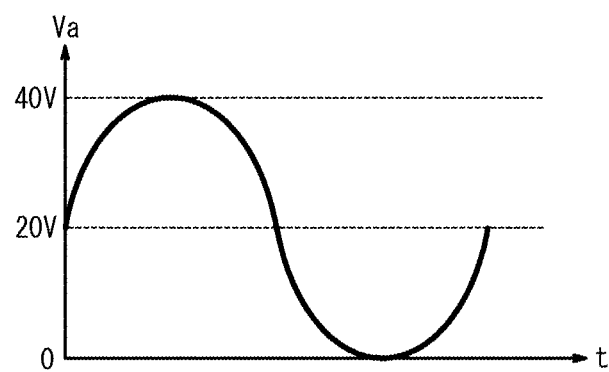
FIGS. 10A and 10B are diagrams illustrating an example of a depolarization state of the piezoelectric element.
Figure 10B:
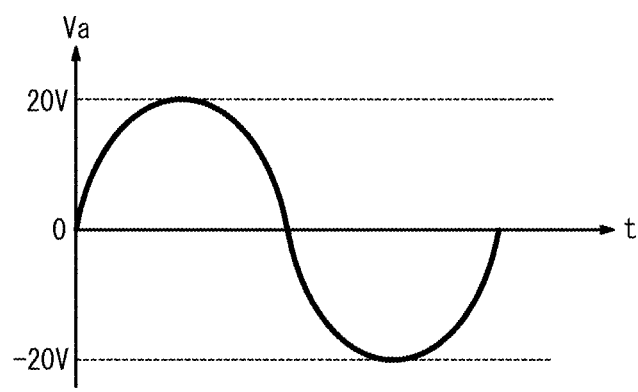

FIGS. 10A and 10B are diagrams illustrating an example where the piezoelectric element is depolarized. In the case where Vc=12V and the voltage of electrode B of the piezoelectric element is set to 0V, even if the voltage Va illustrated in FIG. 10A is applied to electrode A, since condition 1 is satisfied, depolarization does not occur. However, when voltage Va illustrated in FIG. 10B is applied to electrode A of the piezoelectric element, since conditions 1 and 2 are not satisfied, the piezoelectric element is depolarized.

The inventor analyzed the depolarization of the piezoelectric element and found that a piezoelectric element is not depolarized when the voltage applied to one electrode is equal to or greater than the voltage applied to the other electrode. In the present specification, the one electrode is referred to as "positive electrode" and the other electrode is referred to as "negative electrode." Thus, in the electronic device according to the present invention, a driving signal that allows the voltage of the positive electrode of the piezoelectric element to be equal to or greater than the voltage of the negative electrode thereof is applied, and thus the problem of the piezoelectric element not operating normally can be solved.

The following describes in more detail the embodiments of the present invention with reference to the drawings.

First Embodiment

Figure 1:
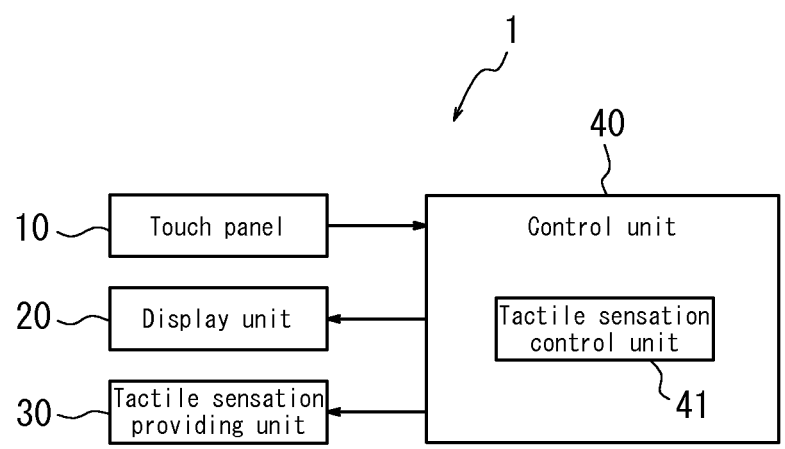
FIG. 1 is a block diagram illustrating a schematic configuration of an electronic device according to a first embodiment of the present invention.

FIG. 1 is a block diagram illustrating a schematic configuration of an electronic device according to a first embodiment of the present invention. As illustrated in FIG. 1, the electronic device 1 includes a touch panel 10, a display unit 20, a tactile sensation providing unit 30 and a control unit 40, and the control unit 40 includes a tactile sensation control unit 41.

The display unit 20 is configured using, for example, a liquid crystal display panel (LCD), an organic EL display panel and the like, and displays objects such as characters, images, videos and the like.

The touch panel 10 is normally disposed on the front face of the display unit 20, and detects a touch on the object displayed on the display unit 20 by an operating body (for example, a finger or a stylus pen) or a release of the touch at the corresponding operation face of the touch panel 10. Further, the touch panel 10 detects a position touched by the operating body on the operation face, and notifies the detected touched position to the control unit 40. The touch panel 10 is configured using a known type such as a resistive film type, a capacitive type and the like.

The control unit 40 determines the processing to be executed based on the information that is input from the touch panel 10. In addition, when the touch panel 10 detects a touch by the operating body, the control unit 40 controls the tactile sensation providing unit 30 by the tactile sensation control unit 41 to provide a predetermined tactile sensation by the tactile sensation providing unit 30.

The tactile sensation providing unit 30 is configured using a piezoelectric element 31, and the piezoelectric element 31 produces a vibration of a predetermined vibration pattern in response to the driving signal applied by the tactile sensation control unit 41, and thus a predetermined tactile sensation is provided to the operating body that touches the operation face of the touch panel 10.

The tactile sensation control unit 41 applies a driving signal for positive electrode to the positive electrode of the piezoelectric element 31, and a driving signal for negative electrode to the negative electrode of the piezoelectric element 31. At that time, to prevent the piezoelectric element 31 from being in a depolarization state, the tactile sensation control unit 41 controls such that the minimum voltage of the driving signal for positive electrode is equal to or greater than the maximum voltage of the driving signal for negative electrode. In addition, the tactile sensation control unit 41 may apply a voltage that is lower than that for the negative electrode to the positive electrode, if the voltage is within the range of not producing a depolarization.

Figure 2:
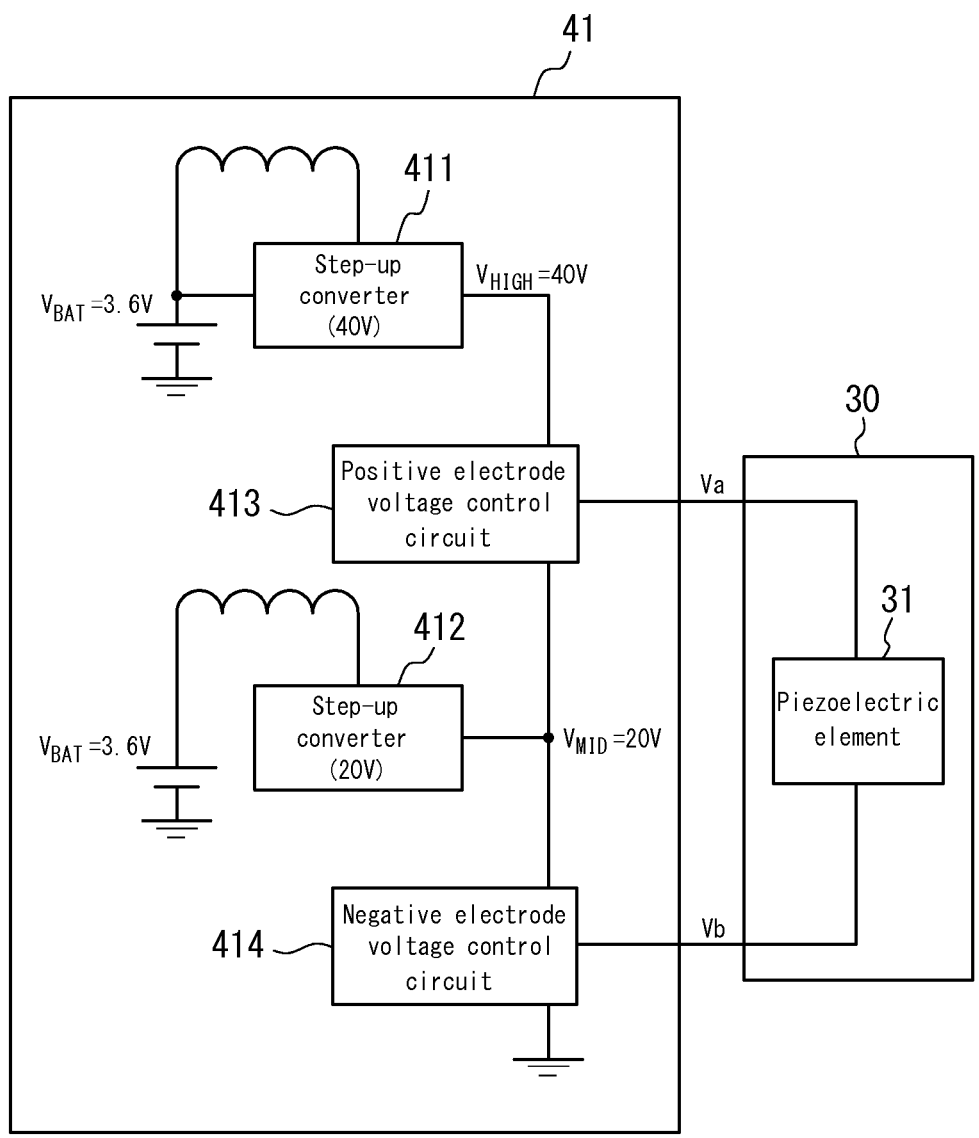
FIG. 2 is a circuit diagram illustrating a configuration of a tactile sensation control unit and a tactile sensation providing unit of the electronic device according to the first embodiment of the present invention.

FIG. 2 is a circuit diagram illustrating a configuration of the tactile sensation control unit 41 and the tactile sensation providing unit 30. The step-up converters 411 and 412 boost an input voltage and output a predetermined voltage. In the present embodiment, the step-up converter 411 boosts the input voltage of 3.6V and produces an output voltage of 40V, and the step-up converter 412 boosts the input voltage of 3.6V and produces an output voltage of 20V.

Figure 3A:
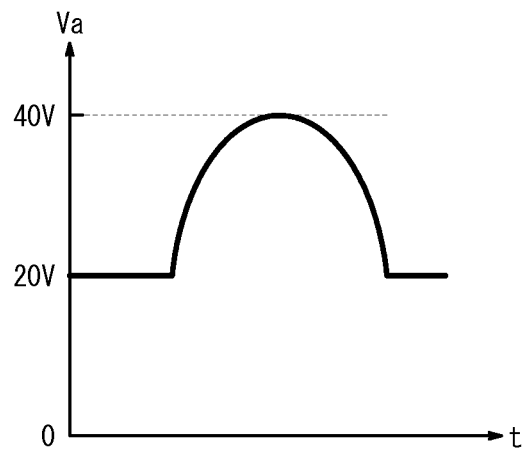
FIGS. 3A to 3C are diagrams illustrating examples of driving signals applied to the piezoelectric element of the electronic device according to the first embodiment of the present invention.
Figure 3B:
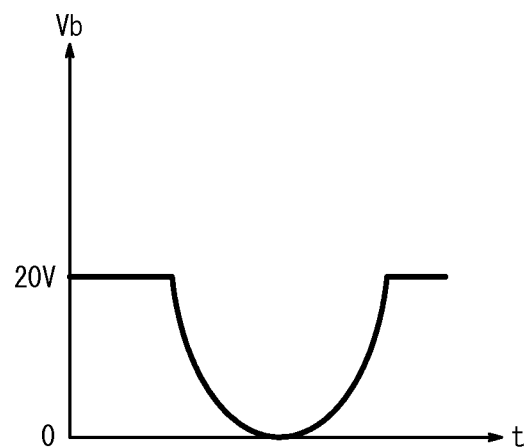
Figure 3C:
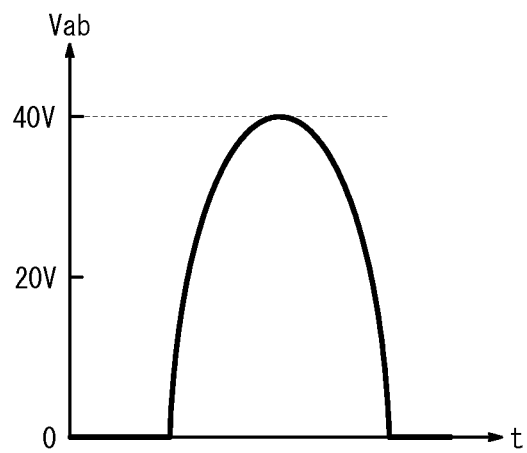

The positive electrode voltage control circuit 413 produces a driving signal for positive electrode Va applied to the positive electrode of the piezoelectric element 31. FIG. 3A illustrates an example of the driving signal for positive electrode Va, and the driving signal for positive electrode Va is a half cycle sine wave with a midpoint potential of 20V and an amplitude of 20V to 40V. The negative electrode voltage control circuit 414 produces a driving signal for negative electrode Vb applied to the negative electrode of the piezoelectric element 31. FIG. 3B illustrates an example of the driving signal for negative electrode Vb, and the driving signal for negative electrode Vb is a half cycle anti-phase sine wave with a midpoint potential of 20V and an amplitude of 0V to 20V. FIG. 3C illustrates a driving signal Vab applied between the positive electrode and the negative electrode of the piezoelectric element 31 when the driving signal for positive electrode Va illustrated in FIG. 3A is applied to the positive electrode of the piezoelectric element 31 and the driving signal for negative electrode Vb illustrated in FIG. 3B is applied to the negative electrode of the piezoelectric element 31.

As illustrated in FIGS. 3A-3C, the driving signal for positive electrode Va applied to the positive electrode is constantly equal to or greater than the driving signal for negative electrode Vb applied to the negative electrode, thus no depolarization occurs. However, the driving signal applied between the positive and the negative electrodes Vab should not exceed the withstand voltage between the positive and the negative electrodes of the piezoelectric element 31. When the withstand voltage is equal to or greater than 40V, even if the driving signal Vab illustrated in FIG. 3C is applied between the positive and the negative electrodes of the piezoelectric element 31, the piezoelectric element 31 can normally operate.

Figure 4A:
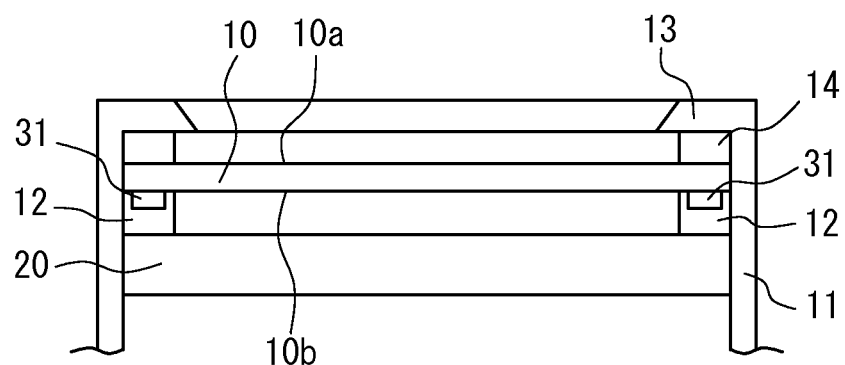
FIGS. 4A and 4B are diagrams illustrating an example of a mounting structure of the electronic device according to the first embodiment of the present invention.
Figure 4B:
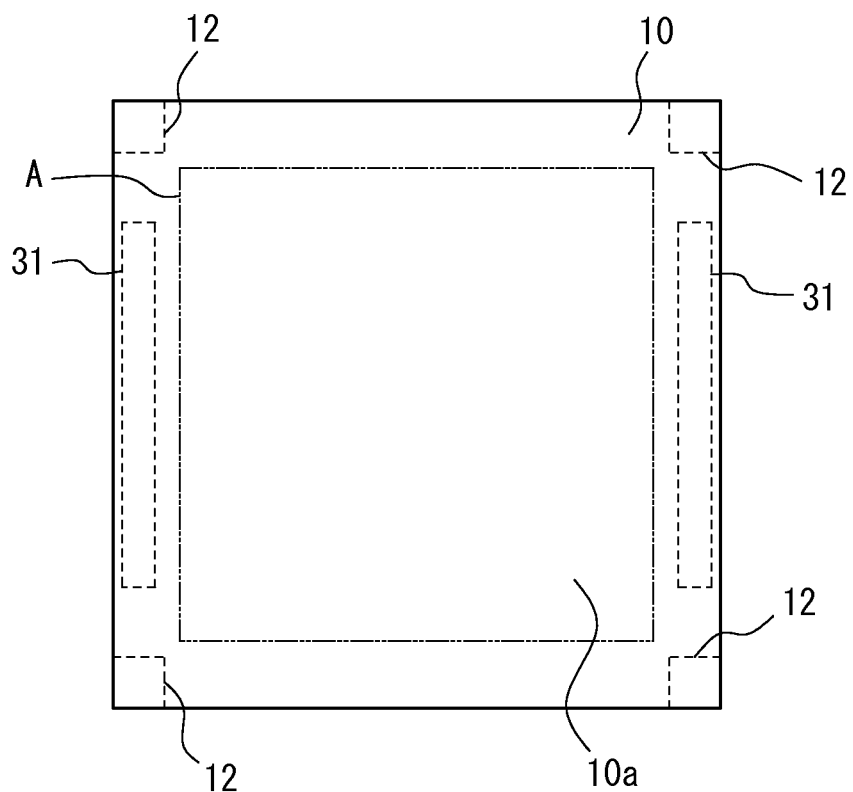

FIGS. 4A and 4B illustrates an example of the mounting structure of the electronic device 1 illustrated in FIG. 1. FIG. 4A is a cross-sectional view of a part and FIG. 4B is a plan view of the part. The display unit 20 is placed and held in the housing 11. On the display unit 20, the touch panel 10 is held via insulators 12 made from an elastic member. In addition, in the electronic device 1 according to the present embodiment, the display unit 20 and the touch panel 10 are a rectangular shape in a plan view. In the present embodiment, the touch panel 10 is held on the display unit 20 via the insulators 12 respectively disposed at four corners, away from the display region A of the display unit 20 illustrated in FIG. 6B by a phantom line.

Moreover, in the housing 11, an upper cover 13 is provided so as to cover a surface region of the touch panel 10 away from the display region of the display unit 20, and an insulator 14 made from an elastic member is disposed between the upper cover 13 and the touch panel 10.

In addition, the surface member having an operation face (surface) 10a of the touch panel 10 illustrated in FIGS. 4A and 4B is configured using, for example, a transparent film or glass, and the back face member having a back face 10b is configured using glass or acrylic. The employed touch panel 10 is configured such that, when the operation face 10a is pressed, the pressed portion thereof flexes (bends) slightly in accordance with the pressing force, or the structure itself flexes slightly.

On the back face 10b of the touch panel 10, piezoelectric vibrators 31 for vibrating the touch panel 10 are provided respectively via adhesive and the like, near each of two opposing sides. In addition, the piezoelectric vibrator 31 vibrates the touch panel 10, and thus the operation face 10a is vibrated. In addition, the housing 11, the upper cover 13 and the insulator 14 illustrated in FIG. 4A are not illustrated in FIG. 4B.

Figure 5A:
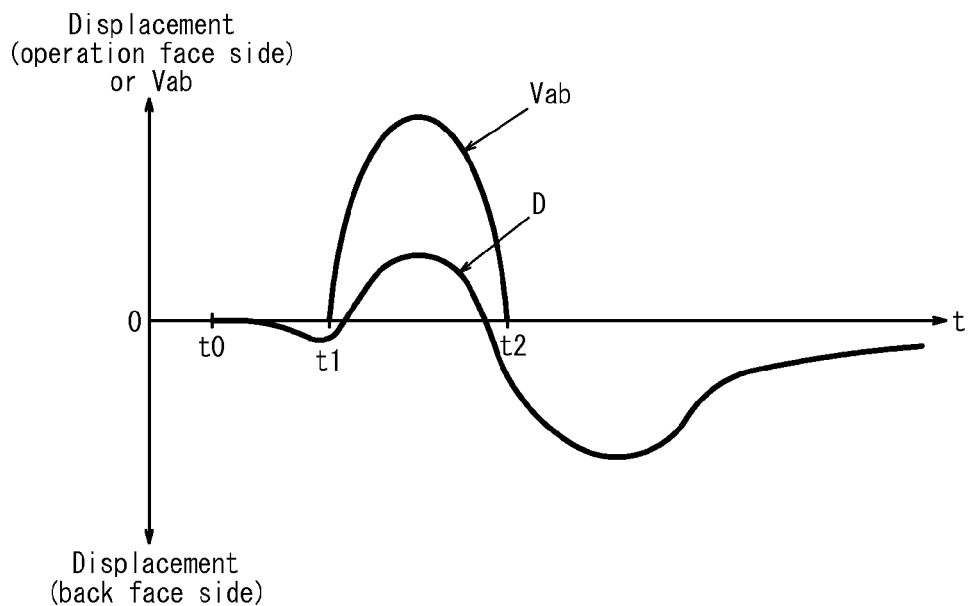
FIGS. 5A and 5B are diagrams illustrating a relationship between a driving signal applied to the piezoelectric element and displacement of the touch panel in the electronic device according to the first embodiment of the present invention.
Figure 5B:
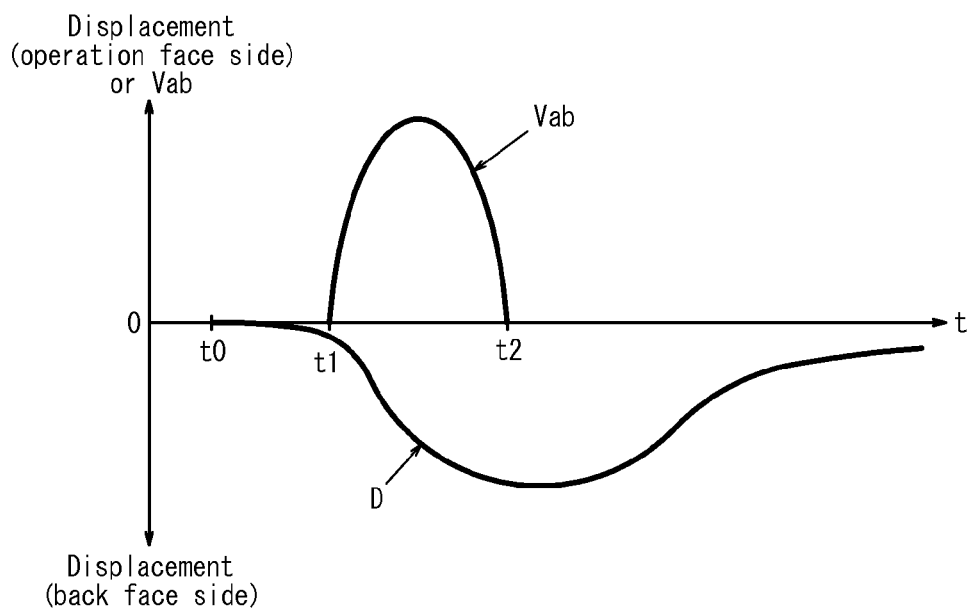

Now the displacement direction of the touch panel 10 by the piezoelectric element 31 is considered. FIG. 5A is a diagram illustrating a displacement D of the touch panel 10 when the touch panel 10 is displaced to the operation face 10a side in response to the driving signal Vab applied between the positive and the negative electrodes of the piezoelectric element 31. FIG. 5B is a diagram illustrating a displacement D of the touch panel 10 when the touch panel 10 is displaced to the back face 10b side in response to the driving signal Vab applied between the positive and the negative electrodes of the piezoelectric element 31. In FIGS. 5A and 5B, as an example, a waveform of the driving signal Vab is a half cycle sine wave. Further, the displacement D of the touch panel 10, when being positive (above 0 of the vertical axis), represents a displacement to the operation face 10a side, and, when being negative (below 0 of the vertical axis), represents a displacement to the back face 10b side.

Figure 6A:
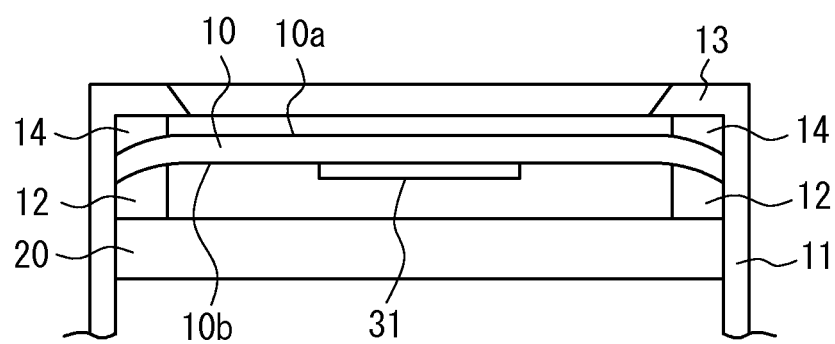
FIGS. 6A and 6B are diagrams illustrating states of displacement of the touch panel in the electronic device according to the first embodiment of the present invention.
Figure 6B:
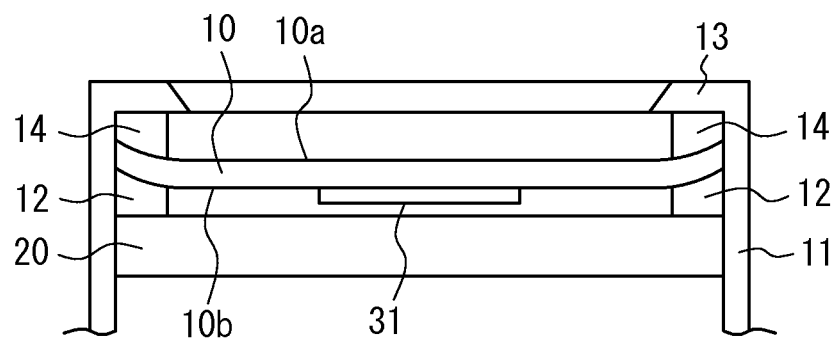

FIG. 6A is a diagram illustrating a state where the touch panel 10 is displaced to the operation face 10a side, and FIG. 6B is a diagram illustrating a state where the touch panel 10 is displaced to the back face 10b side. FIG. 4A is a cross-sectional diagram viewing from the short side of the piezoelectric element 31, and FIGS. 6A and 6B illustrate a cross-sectional diagram viewing from the long side of the piezoelectric element 31. Although the amount of displacement of the touch panel 10 is actually about several tens of μm, the amount of displacement is exaggeratedly illustrated to show a state of displacement.

In FIGS. 5A and 5B, time t0 represents the time at which the operating body starts pressing the touch panel 10. When the touch panel 10 detects a touch by the operating body, the tactile sensation control unit 41 applies, as illustrated in FIGS. 5A and 5B, a driving signal Vab between the positive and the negative electrodes of the piezoelectric element 31 during the time from t1 to t2. As illustrated in FIG. 5A, when the touch panel 10 is displaced to the operation face 10a side in response to the driving signal Vab, the potential energy increases with increase of the amount of displacement, and a force to restore to the back face 10b works on the touch panel 10. In addition, a force of the operating body to push to the back face 10b side is added, thus displacement to the back face 10b side increases with decrease of the driving signal Vab. Therefore, the amount of displacement of the touch panel 10 increases, and the electronic device 1 reliably provides a realistic tactile sensation that can be recognized by the operator with a small power consumption. Further, the touch panel 10 displaces once to the direction that is different from the direction of press by the operator, and thus the operator can reliably recognize that a tactile sensation has been provided by the electronic device 1.

On the other hand, as illustrated in FIG. 5B, when the touch panel 10 is displaced to the back face 10b side in response to the driving signal Vab, with a force of the operating body to push to the back face 10b side, first the touch panel 10 is largely displaced to the back face 10b side, however, soon after that, a force to restore the touch panel 10 to the operation face 10a side works. Thus compared to the case illustrated in FIG. 5A, the amount of displacement of the touch panel 10 is smaller. Therefore, in order to provide a tactile sensation reliably to the operator with a small power consumption, it is preferable that the piezoelectric element 31 displaces the touch panel 10 to the operation face 10a side in response to the driving signal Vab applied between the positive and the negative electrodes. In this case, displacement to the operation face 10a side includes an aspect in which the operation face 10a bends in a convex state.

Figure 7A:
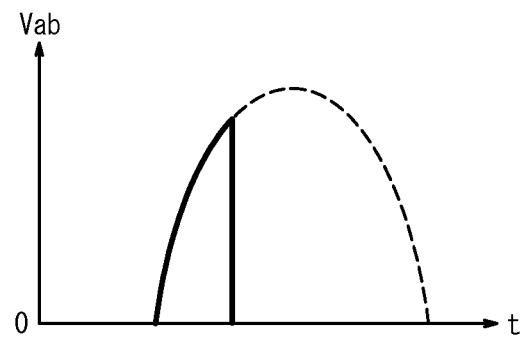
FIGS. 7A to 7C are diagrams illustrating the driving signals applied to the piezoelectric element in the electronic device according to the first embodiment of the present invention.
Figure 7B:
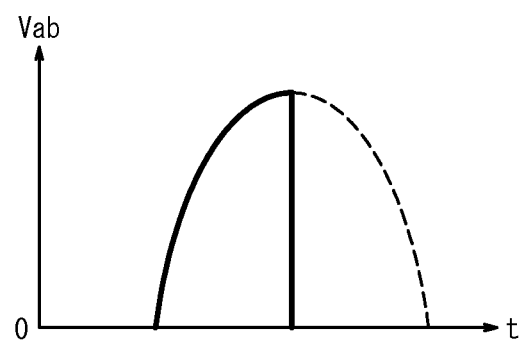
Figure 7C:
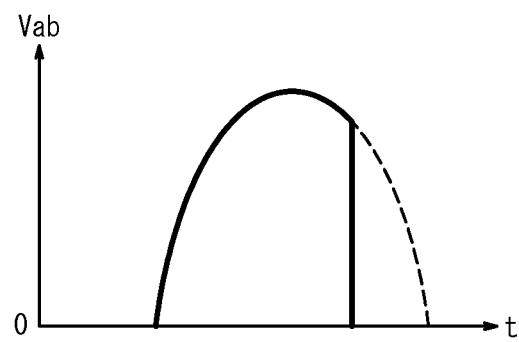

Next, a waveform of the driving signal Vab applied between the positive and the negative electrodes of the piezoelectric element 31 is discussed. As the fluctuation of the amplitude of the driving signal Vab increases, the amount of displacement of the touch panel 10 increases. Thus, compared to the case where the driving signal Vab is a signal of less than a quarter cycle sine wave as illustrated in FIG. 7A, the touch panel 10 can be displaced larger with the driving signal Vab that includes a peak of sine wave as illustrated in FIGS. 7B and 7C. Thus the cycle of driving signal Vab is preferably any cycle from a quarter cycle to a half cycle of the periodic wave. For example, frequency of the driving signal is equal to or greater than 140 Hz and equal to or less than 250 Hz. In addition, FIGS. 7A and 7B illustrate a sine wave, but it may be a triangular wave.

Thus, in the electronic device 1 according to the present embodiment, the control unit 40 controls so that the minimum voltage of the driving signal for positive electrode Va is equal to or greater than the maximum voltage of the driving signal for negative electrode Vb, thus a depolarization of the piezoelectric element 31 can be prevented.

Further, when the driving signal for positive electrode Va and the driving signal for negative electrode Vb are applied, the piezoelectric element 31 displaces the touch panel 10 to the operation face 10a side, not to the back face 10b side, and thus the operator can reliably recognize that a tactile sensation has been provided. Specifically, the control unit 40 controls so that the cycle of driving signal Vab applied between the positive and the negative electrodes of the piezoelectric element 31, by the driving signal for positive electrode Va and the driving signal for negative electrode Vb, is any cycle from a quarter cycle to a half cycle of periodic wave, thereby increasing a displacement of the touch panel 10, and thus the operator can reliably recognize that a tactile sensation has been provided. Further, as the cycle of driving signal Vab decreases within the range from a quarter cycle to a half cycle of periodic wave, the power consumption can be reduced.

Second Embodiment

Figure 8:
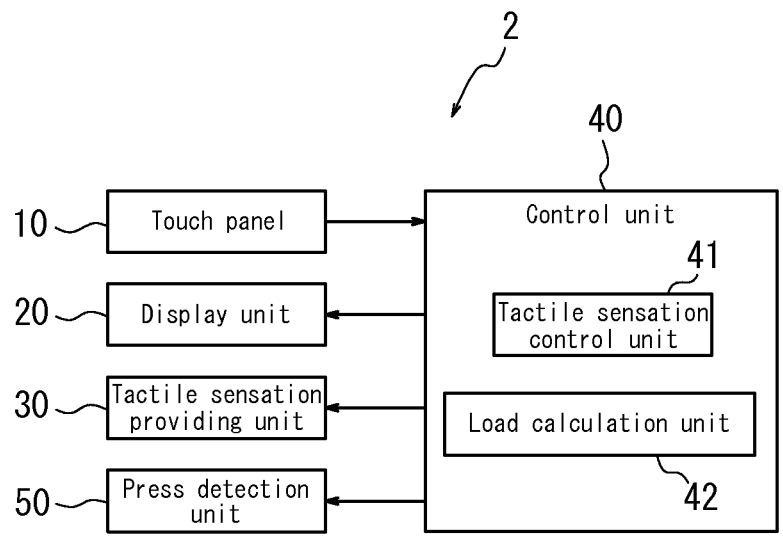
FIG. 8 is a block diagram illustrating a schematic configuration of an electronic device according to a second embodiment of the present invention.

Next, the electronic device according to the second embodiment of the present invention will be described. FIG. 8 is a block diagram illustrating a schematic configuration of an electronic device according to the second embodiment of the present invention. As illustrated in FIG. 8, the electronic device 2 includes a touch panel 10, a display unit 20, a tactile sensation providing unit 30, a control unit 40 and a press detection unit 50, and the control unit 40 includes a tactile sensation control unit 41 and a load calculation unit 42. The electronic device 2 of the second embodiment differs from the electronic device 1 of the first embodiment in that the electronic device 2 further includes a press detection unit 50 and the control unit 40 further includes a load calculation unit 42. In addition, the same reference signs are used to the components that are identical to those of the first embodiment, and the description thereof is omitted.

The press detection unit 50 is configured using a piezoelectric element, and detects a press on the operation face 10a of the touch panel 10. The piezoelectric element may be provided separately from that used for the tactile sensation providing unit 30, or a common piezoelectric element may be provided. In the present embodiment, description is given assuming that a common piezoelectric element 31 is used. The load calculation unit 42 detects a voltage that is output from the piezoelectric element 31 and calculates a pressing load.

The control unit 40 calculates the pressing load by the load calculation unit 42 and, when the calculated pressing load satisfies a predetermined criterion, applies a driving signal for positive electrode Va and a driving signal for negative electrode Vb to the piezoelectric element 31 by the tactile sensation control unit 41. In this case, "when the pressing load satisfies a predetermined criterion" may be, regarding the predetermined criterion as a reference value, the time at which the pressing load reaches the reference value, the pressing load exceeds the reference value, or the reference value is detected by the press detection unit 50. The predetermined value may be, for example, 1N.

Figure 9:
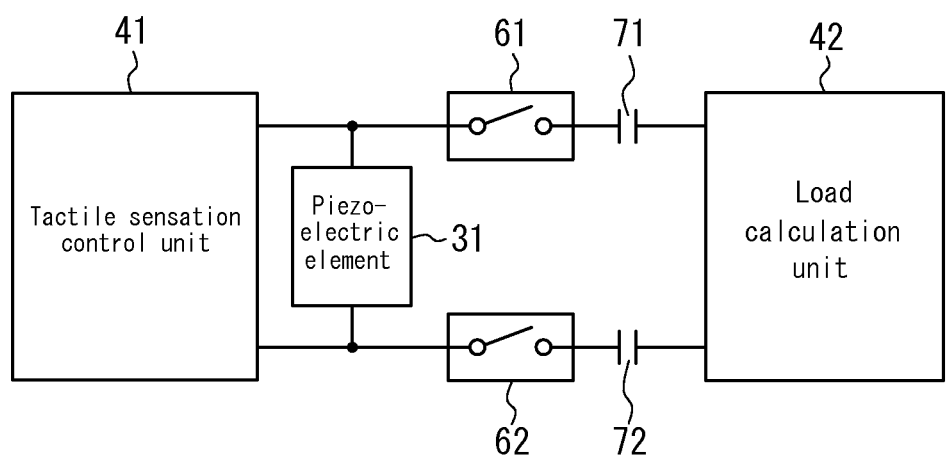
FIG. 9 is a block diagram illustrating a schematic configuration of a tactile sensation control unit, a load calculation unit and a piezoelectric element in the electronic device according to the second embodiment of the present invention.

FIG. 9 is a block diagram illustrating a schematic configuration of the tactile sensation control unit 41, the load calculation unit 42 and the piezoelectric element 31. When the piezoelectric element 31 is functioned as the press detection unit 50, the control unit 40 switches the changeover switches 61 and 62 to ON. At this time, the midpoint potential (e.g. 20V) of the tactile sensation control unit 41 is different from that (e.g. 1.3V) of the load calculation unit 42, thus DC component is cut by capacitors 71 and 72 to extract only AC component.

On the other hand, when the piezoelectric element 31 is functioned as the tactile sensation providing unit 30, the control unit 40 switches the changeover switches 61 and 62 to OFF to prevent a driving signal applied to the piezoelectric element 31 from being input to the load calculation unit 42. Further, as in the case of the electronic device 1 according to the first embodiment, control is performed such that the minimum voltage of the driving signal for positive electrode Va is equal to or greater than the maximum voltage of the driving signal for negative electrode Vb by the tactile sensation control unit 41, and, by vibrating the piezoelectric element 31, a predetermined tactile sensation is provided to the operating body that touches the operation face of the touch panel 10.

When a common piezoelectric element 31 is used by the tactile sensation providing unit 30 and the press detection unit 50, as described above, the changeover switches 61 and 62 should be switched. However, when switching, a pop noise may occur. In order to cancel a pop noise occurring when switching, the load calculation unit 42 calculates the differential voltage between the voltage of AC component resulting from blocking of DC component by the capacitor 71 and the voltage of AC component resulting from blocking of DC component by the capacitor 72. The load calculation unit 42 calculates the pressing load detected by the press detection unit 50 based on the differential voltage, thereby calculating an appropriate pressing load without being influenced by a pop noise.

Thus, in the electronic device 2 of the present embodiment, when the pressing load detected by the press detection unit 50 satisfies a predetermined criterion, the control unit 40 applies a driving signal for positive electrode Va and a driving signal for negative electrode Vb to the piezoelectric element 31, and thus a tactile sensation is not provided when the operating body merely touches the touch panel 10 lightly, that is, when the operator does not intend to press the touch panel 10, and further, a more realistic tactile sensation can be provided by adjusting the timing of applying a pressing load and a driving signal. Moreover, when the pressing load detected by the press detection unit 50 satisfies a predetermined load, the control unit 40 applies a driving signal so that the piezoelectric element displaces the touch panel 10 to the operation face 10a side, which is a direction different from that strongly pressed by the operator to satisfy a predetermined load, and thus different from the case where the touch panel 10 is displaced to the back face 10b side, a tactile sensation that can be recognized by the operator can reliably be provided with a small power consumption.

Further, the load calculation unit 42 calculates the differential voltage between the voltage of AC component resulting from cutting DC component by the capacitor 71 and the voltage of AC component resulting from cutting DC component by the capacitor 72, and based on the differential voltage, calculates the pressing load detected by the press detection unit 50, thus a pop noise occurring during switching of the changeover switch 61 and the changeover switch 62 can be cancelled.

The above described embodiments are described as representative examples, and it is obvious for a person skilled in the art that various changes and substitutions may be made within the intention and the scope of the present invention. Thus the present invention should not be construed as limited by the above-described embodiments, and various modifications and changes may be made without departing from the scope of claims.

For example, in the above-described embodiments, description was given assuming that the touch panel 10 is overlaid on the front face of the display unit 20. However, it is not necessary to configure in this manner, and the touch panel 10 and the display unit 20 may be spaced apart.

Further, the touch panel 10 and the display unit 20 according to the above-described embodiments of the present invention may be configured using an integrated electronic device by providing a common substrate that has the functions of both the touch panel 10 and the display unit 20. An example of configuration of a device having an integrated function of the touch panel 10 and the display unit 20 is a configuration in which, a plurality of photoelectric conversion elements such as photodiodes are regularly mixed in pixel electrodes arranged in a matrix in a liquid crystal panel. Such an electronic device displays an image by a liquid crystal panel structure, and reflects the light of backlight for a liquid crystal display by a tip of pen for touch input at a desired position of the surface of panel as well. Then the reflected light is received by the surrounding photoelectric conversion elements, and thus such an electronic device can detect the touched position.

Moreover, in the above-described embodiments, the touch panel 10 is used to detect a touch on the operation face 10a. However, the press detection unit 50 may be used to determine that a touch is made when a predetermined pressing load criterion is satisfied.

Further, in the above-described embodiments, the control unit 40 applies, as a driving signal, a driving signal for positive electrode to the positive electrode of the piezoelectric element 31 and a driving signal for negative electrode to the negative electrode of the piezoelectric element 31. However, in order to prevent the piezoelectric element 31 from being in a depolarized state, the control unit 40 may apply either a driving signal for positive electrode or a driving signal for negative electrode so that the voltage of the positive electrode of the piezoelectric element 31 is equal to or greater than the voltage of the negative electrode thereof. In such a case, it is preferable that the function of the above-described embodiments is realized not by the differential circuit described in this specification, but by an appropriately modified circuit.

Furthermore, in the above-described embodiments, the control unit 40 calculates a pressing load by the load calculation unit 42 and when the calculated pressing load satisfies a predetermined criterion, a signal is applied to the piezoelectric element 31. However, the control unit 40 may, without calculating a pressing load by the load calculation unit 42, use the voltage (data based on press) detected by the load calculation unit 42 and may, when the voltage satisfies a predetermined criterion (a predetermined criterion to the voltage), apply a signal to the piezoelectric element. In addition, the data based on press includes a pressing load.

REFERENCE SIGNS LIST 1,2 electronic device
10 touch panel
10a operation face
10b back face
11 housing
13 upper cover
14 insulator
20 display unit
30 tactile sensation providing unit
31 piezoelectric element
40 control unit
41 tactile sensation control unit
42 load calculation unit
50 press detection unit
61, 62 changeover switch
71, 72 capacitor
411, 412 step-up converter
413 positive electrode voltage control circuit
414 negative electrode voltage control circuit

The invention claimed is:

1. An electronic device comprising:
a piezoelectric element; and
a control unit configured to apply a driving signal to the piezoelectric element, wherein
the control unit applies a first driving signal to a positive electrode of the piezoelectric element, and a second driving signal of which a voltage is constantly equal to or less than a voltage of the first driving signal, to a negative electrode thereof wherein the voltages of the positive electrode and the negative electrode of the piezoelectric element are anti-phase sine waves to each other having a common midpoint potential.

2. The electronic device according to claim 1, wherein a minimum voltage of the first driving signal for the positive electrode is equal to or greater than a maximum voltage of the second driving signal for the negative electrode.

3. The electronic device according to claim 1, further comprising a touch panel, wherein, the piezoelectric element, when being applied with the first and second driving signals, displaces the touch panel to an operation face side of the touch panel.

4. The electronic device according to claim 1, wherein the control unit controls a cycle of the first and second driving signals applied to the piezoelectric element to be any cycle from a quarter cycle to a half cycle of a periodic wave.

5. The electronic device according to claim 3, further comprising a press detection unit configured to detect a press on the operation face of the touch panel, wherein, when data based on press detected by the press detection unit satisfies a predetermined criterion, the control unit applies the first and second driving signals to the piezoelectric element.

* * * * *